(12) United States Patent
Shimomura et al.

(10) Patent No.: US 7,501,914 B2
(45) Date of Patent: Mar. 10, 2009

(54) BIAS CIRCUIT

(75) Inventors: Kenkichi Shimomura, Tokyo (JP);
Takashi Sugihara, Tokyo (JP);
Katsuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 166 days.

(21) Appl. No.: 11/587,678

(22) PCT Filed: Apr. 28, 2004

(86) PCT No.: PCT/JP2004/006110

§ 371 (c)(1),
(2), (4) Date: Oct. 26, 2006

(87) PCT Pub. No.: WO2005/107063

PCT Pub. Date: Nov. 10, 2005

(65) Prior Publication Data

US 2008/0048783 A1    Feb. 28, 2008

(51) Int. Cl.
*H03H 7/00* (2006.01)
*H03H 7/38* (2006.01)
*H01P 3/00* (2006.01)

(52) U.S. Cl. .......................... 333/172; 333/32
(58) Field of Classification Search .......... 333/32, 333/172, 175
See application file for complete search history.

(56) References Cited

U.S. PATENT DOCUMENTS

| | | | |
|---|---|---|---|
| 5,534,825 A | 7/1996 | Goma et al. | |
| 5,736,901 A * | 4/1998 | Nakamura et al. | .......... 330/296 |
| 6,310,517 B1 | 10/2001 | Nakahara et al. | |
| 6,836,622 B2 | 12/2004 | Kobayashi et al. | |
| 2002/0063602 A1 | 5/2002 | Asada | |

FOREIGN PATENT DOCUMENTS

| | | |
|---|---|---|
| JP | 63-191891 U | 12/1988 |
| JP | 64-89707 A | 4/1989 |
| JP | 1-15226 Y2 | 5/1989 |
| JP | 3-216003 A | 9/1991 |
| JP | 5-21448 U | 3/1993 |
| JP | 6-196928 A | 7/1994 |
| JP | 11-220337 A | 8/1999 |
| JP | 2000-151325 A | 5/2000 |
| JP | 2000-196379 A | 7/2000 |
| JP | 2002-171143 A | 6/2002 |
| WO | WO-01/03290 A1 | 1/2001 |
| WO | WO-2005/025094 A1 | 3/2005 |

* cited by examiner

*Primary Examiner*—Dean O Takaoka
(74) *Attorney, Agent, or Firm*—Birch, Stewart, Kolasch & Birch, LLP

(57) ABSTRACT

A bias circuit that supplies bias voltage or bias current to one end of a transmission line includes an inductor that prohibits a high frequency component of a baseband signal transmitted on the transmission line and passes a frequency component near direct current of the baseband signal, and an impedance-decrease prevention element that prevents impedance from decreasing, when viewed from the transmission line, that is produced due to a resonance between a parasitic capacitance generated due to the inductor and an inductance of the inductor.

11 Claims, 14 Drawing Sheets

CONVENTIONAL ART

CONVENTIONAL ART

BIAS CIRCUIT

TECHNICAL FIELD

The invention relates to a bias circuit and particularly to a bias circuit that applies direct current (DC) bias to a semiconductor element, an optical modulator, or the like that amplifies a signal, such as like a baseband signal, having a broad spectral component from a low frequency to a high frequency near DC.

BACKGROUND ART

A bias circuit that can be used in a communication device that deals with signals whose spectrums are concentrated near a clock frequency, such as in the microwave communication, has been disclosure in the patent document 1. In the patent document 1, a technique is implemented that a short stub having a length of a quarter wave of a clock frequency is used to realize a high impedance near a signal spectral frequency to thereby decreasing impedance in a positive manner with respect to other frequencies including DC.

The patent document 2 discloses a technique for applying bias to a portion of high impedance, such as gate bias in a transistor. In the patent document 2, a resistor having sufficiently larger impedance than that in a transmission line is used to apply the bias.

In the approach of using the short stub of a quarter-wave length as disclosed in the patent document 1, however, a problem arises in that the stub can be used in an amplifying circuit that amplifies a signal whose spectrum is concentrated near a clock frequency, but can not be used in an amplifying circuit that amplifies a baseband signal that has a wide range of spectrum component.

The approach of using a resistor that has a substantially larger impedance than that in a transmission line as disclosed in the patent document 2 has a problem in that, for example, when applying bias voltage to a terminal necessary for current to be supplied such as a drain terminal, though the approach is rather easy to accommodate a tendency to growing broadband based on an original property of a resistor that fundamentally has a broadband property, it is necessary to apply bias voltage to which an amount of voltage drop in the resistor is added, thereby causing larger power source voltage.

To address these problems, there exists a bias circuit that has a property of high impedance with respect to a broadband signal and low impedance near DC (for example, the non-patent document 1 or the like). In such a bias circuit, an inductor is provided that blocks a broadband signal between bias power source and an object bias-applied.

Patent Document 1
Japanese Patent Application Laid-open No. 2000-196379
Patent Document 2
Japanese Patent Application Laid-open No. H3-216003
Non-Patent Document 1
Anritsu Electronic Meter General Catalog (CD-ROM version) 2003, pp. 520

In the approach of blocking an alternating current (AC) signal by use of the inductor, it is necessary to use an inductor that has high inductance component, keeps an inductive property at a high frequency region, and has a good frequency property.

In the approach disclosed in the non-patent document 1, however, there exists a problem that, when mounting an inductor, even a slight amount of parasitic capacitance between a mounting pattern and a ground potential causes serial resonance, and the impedance of the bias circuit at the resonance frequency of the serial resonance becomes very low, so that the desired characteristic can not be achieved.

The problem is caused by a partial omission of a signal or a reduction in a signal level produced due to the fact that, when the serial resonance occurs, a frequency component of the broadband signal passing an input terminal near the resonance frequency flows, instead of flowing toward an output terminal, toward the bias circuit with low impedance.

Note that because information of a baseband signal is added to a value of current or voltage at a specific timing of a time axis, even a little amount of deleted specific frequency component or reduced signal level with respect to electric power of a signal in total translates to an increased error rate resulting from a degraded time wave.

In view of these circumstances, it is an object of the present invention to provide a bias circuit in which a baseband signal is prevented from being partially omitted, which results from resonance, and signal characteristic degradation is controlled.

DISCLOSURE OF INVENTION

According to an aspect of the present invention, a bias circuit that supplies bias voltage or bias current to one end of a transmission line includes an inductor that prohibits a high frequency component of a baseband signal transmitted on the transmission line and passes a frequency component near direct current; and an impedance-decrease prevention element that prevents impedance from decreasing, when viewed from the transmission line, that is produced due to a resonance between a parasitic capacitance generated due to the inductor and an inductance of the inductor.

According to an aspect of the invention, an impedance component of a parallel circuit made up of an inductor provided in a bias circuit and an impedance decreasing prevention element has not only an inductive reactance component but also a resistance component. Resultingly, even after a parasitic capacitance component generated due to mounting of the inductor is negated, the resistance component remains, and decrease of impedance is prevented when viewed from a transmission line.

BEST MODE(S) FOR CARRYING OUT THE INVENTION

With reference to the accompanied drawings, exemplary embodiments of a bias circuit according to the present invention will be explained in detail below. The invention is not limited to the embodiments.

FIRST EMBODIMENT

Figure 1:
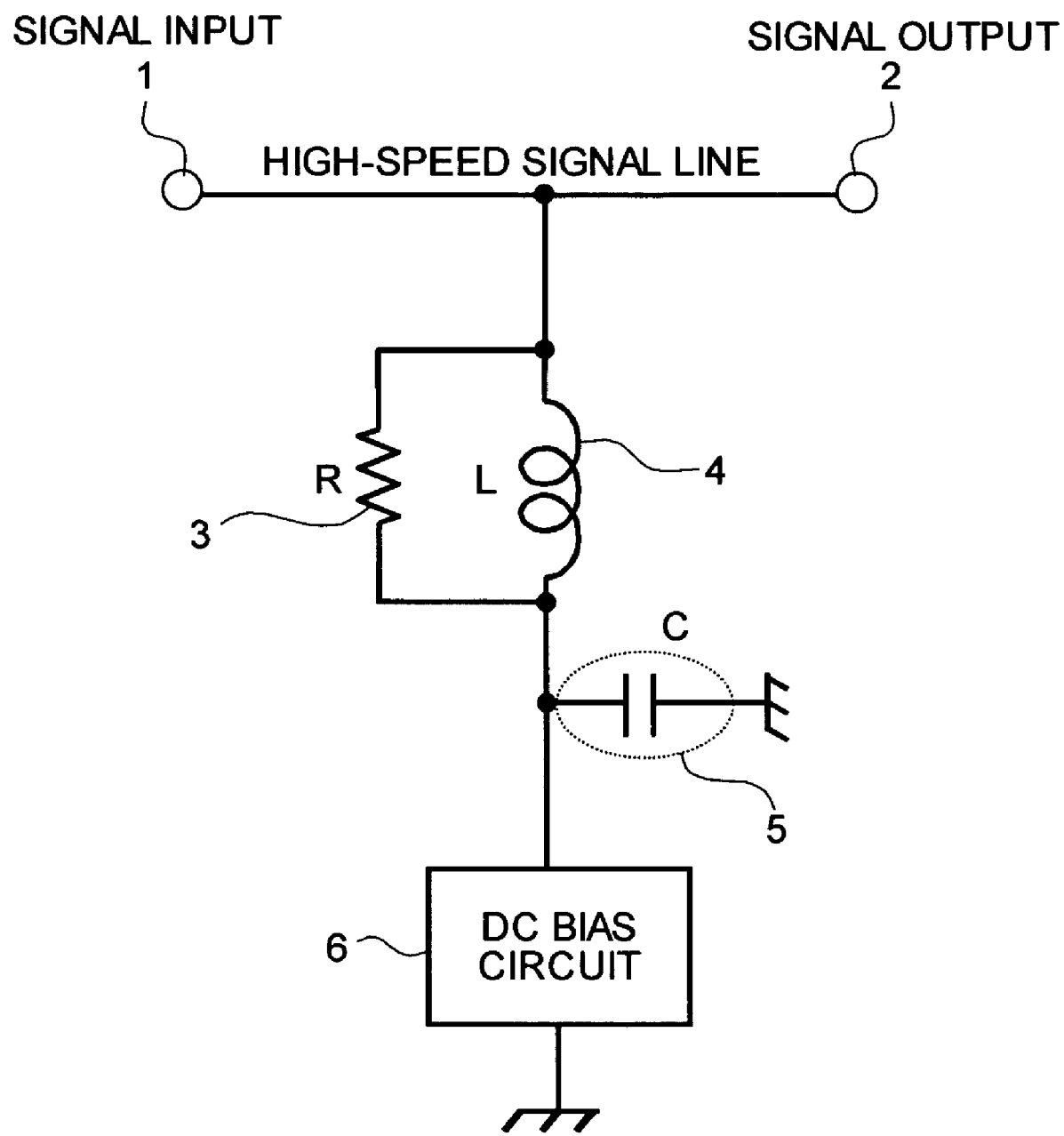
FIG. 1 is a circuit diagram of a bias circuit according to a first embodiment of the invention.

FIG. 1 is a circuit diagram of the bias circuit according to a first embodiment of the present invention. The bias circuit shown in FIG. 1 is configured, for example, to supply bias voltage (or bias current, hereinafter, referred to "bias power source") to one end of a high-speed signal line having a signal input end 1 and a signal output end 2. In FIG. 1, the bias power source output from a DC bias circuit 6 constituted by a conventional art is supplied to one end of the high-speed signal line through a parallel circuit including a resistance element 3 and an inductor 4. The inductor 4 is for blocking the above-described AC signal. A capacitor 5 is a parasitic capacitance generated between the mounting pattern and a ground potential. One end of the capacitor 5 is connected to one end of the parallel circuit composed of the resistance element 3 and the inductor 4, and the other end is grounded by connecting to a ground.

Figure 2A:
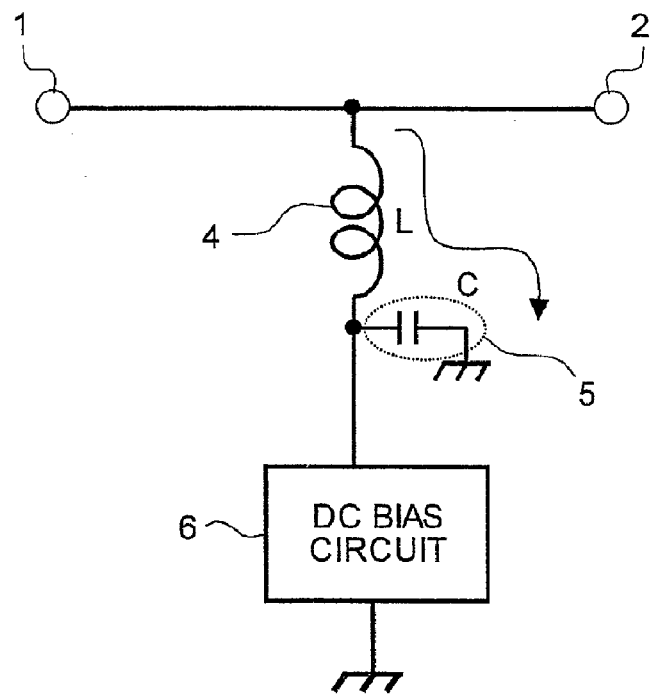
FIG. 2A is a circuit diagram of a conventional bias circuit that does not include a resistance element 3 of the bias circuit shown in FIG. 1.
Figure 2B:
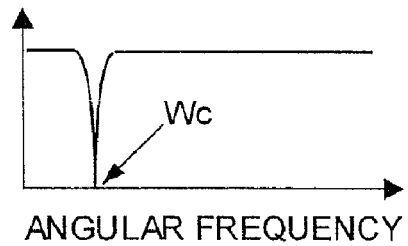
FIG. 2B is a graph of a transit characteristic with respect to an angular frequency in the bias circuit shown in FIG. 2A.

Next, an explanation will be given about an operation of the bias circuit shown in FIG. 1. Prior to giving the explanation of the operation in FIG. 1, a circuit characteristic in the bias circuit in which the resistance element 3 is excluded from the configuration of FIG. 1 is discussed. FIG. 2A is a circuit diagram of the bias circuit in which the resistance element 3 is excluded from the configuration of FIG. 1. FIG. 2B is a graph depicting a transmission characteristic with respect to an angular frequency of the bias circuit shown in FIG. 2A.

The circuit configuration shown in FIG. 2A has a resonance frequency (or, a resonance angular frequency) that causes the inductor 4 and the capacitor 5 to generate serial resonance. As a result, near the resonance frequency, when the bias circuit is viewed from the side of the high-speed signal line, impedance becomes very low and the signal transmission characteristic deteriorates as shown in FIG. 2B.

Figure 3A:
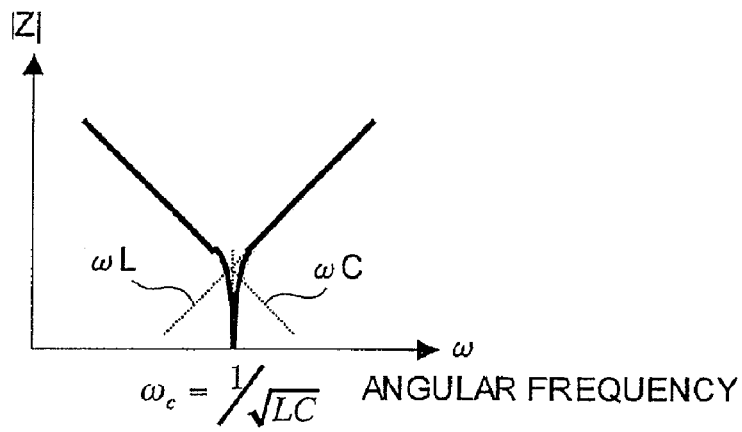
FIG. 3A is a schematic diagram of an impedance-frequency characteristic in an LC resonance circuit in the conventional circuit shown in FIG. 2A.
Figure 3B:
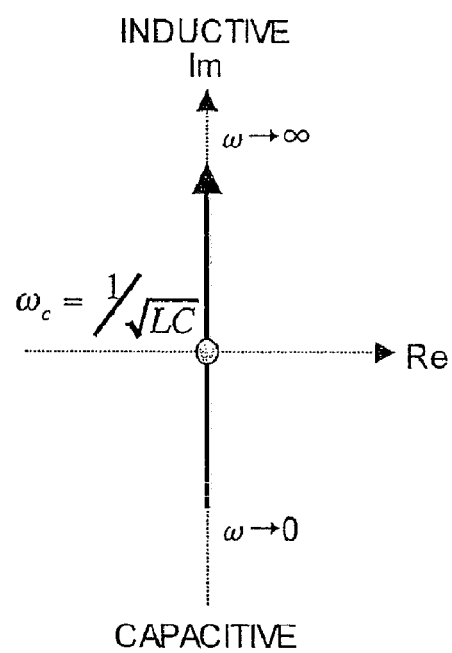
FIG. 3B is a diagram of an impedance orbit in the LC resonance circuit.

FIG. 3A is a schematic diagram of an impedance-frequency characteristic in an LC resonance circuit in the conventional circuit shown FIG. 2A. FIG. 3B is a diagram of an impedance orbit of the LC resonance circuit.

When an angular frequency ω increases from 0 to ∞, a reactance component of impedance in the circuit changes from capacitive to inductive, serving a certain angular frequency as a border. The frequency (i.e., the angular frequency) determining this changing point is the resonance frequency (i.e., the resonance angular frequency), which has a portion of a deeply sunk dip on a curved line in FIG. 3A, or which is at the origin of the coordinate system in FIG. 3B.

For example, when an inductance of the inductor 4 shown in FIG. 2A is 1 microhenry and a parasitic capacitance of the capacitor 5 is 1 picofarad, the resonance frequency is about 150 megahertzs.

Now, considering a baseband signal as an example of a broadband signal, it is said that omission of a signal component or reduction in the signal level can lead to a distorted signal waveform to cause a degraded signal characteristic in a frequency region with a several times to $1/10000$ signal bit rate as a general guideline. In other words, the speed of the baseband signal to which the bias circuit in FIG. 2A that is the above-described example and is made up of inductance 1 microhenry and parasitic capacitance 1 picofarad is applied is limited to 1500 Giga bits per second or more. As a result, the bias circuit indicated in FIG. 2A is unrealistic.

Figure 4A:
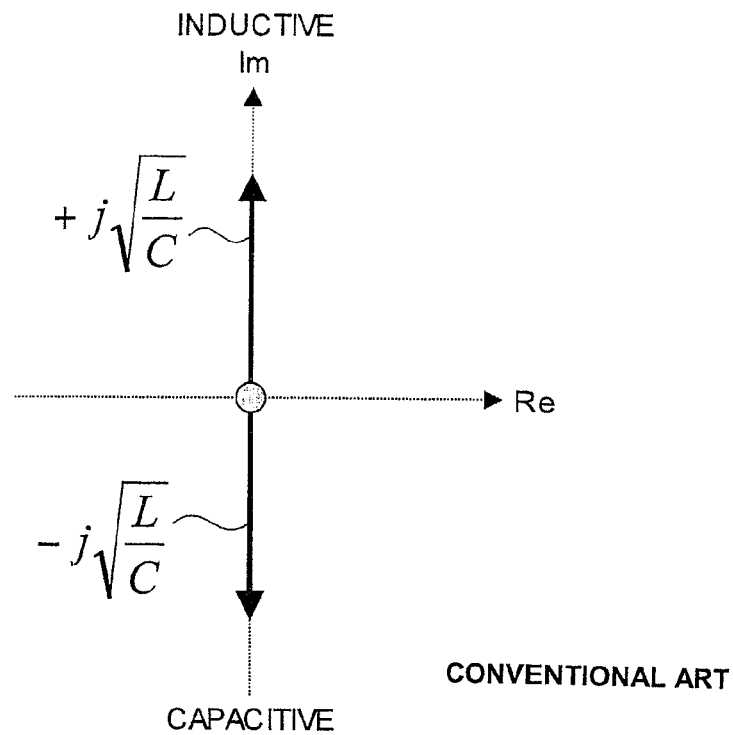
FIG. 4A is a schematic diagram of each impedance vector in resonance frequencies in the conventional circuit shown in FIG. 2A.
Figure 4B:
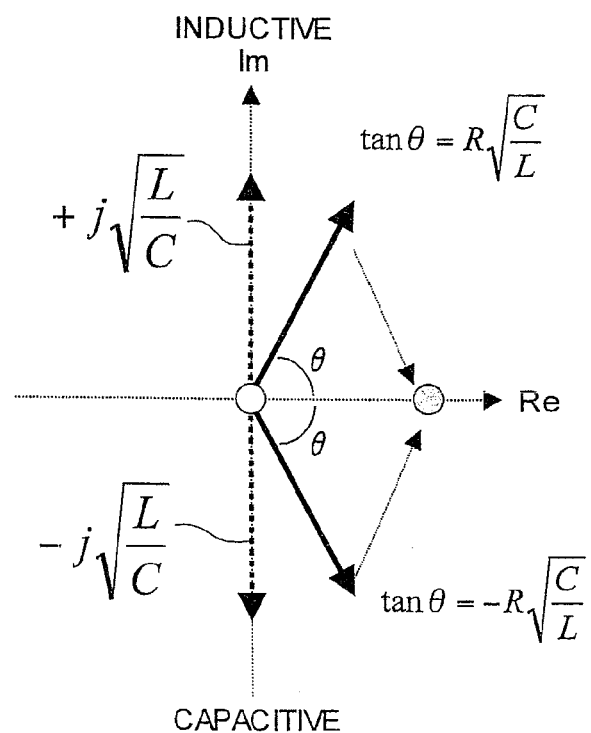
FIG. 4B is a schematic diagram of each impedance vector in resonance frequencies in the circuit according to the first embodiment shown in FIG. 1.

Next, an explanation will be given about a role of the resistance element 3 added in parallel to the inductor 4 in the bias circuit shown in FIG. 1 by use of FIGS. 4A and 4B. FIG. 4A is a schematic diagram of each impedance vector in resonance frequencies of the conventional circuit shown in FIG. 2A. FIG. 4B is a schematic diagram of each of impedance vectors in resonance frequencies of the circuit of the first embodiment shown in FIG. 1. That is, the difference between FIG. 4A and FIG. 4B is only whether there is the resistance element 3.

With regard to FIG. 2A, when an inductance of the inductor 4 is L and a capacitance of the capacitor 5 is C, the resonance angular frequency $\omega_c$ of a serial resonance circuit made up of the inductor 4 and the capacitor 5 can be indicated with the following equation:

$$\omega_c = 1/\sqrt{LC} \qquad (1)$$

In addition, if, using the resonance angular frequency $\omega_c$, a inductive component in the reactance component in the serial resonance circuit (hereinafter, "an inductive reactance component") is denoted as $X_L$ and a capacitive component (hereinafter, "a capacitive reactance component") is denoted as $X_C$, both of $X_L$ and $X_C$ can be represented with the following equations by use of Equation (1):

$$X_L = j\omega L = j\sqrt{L/C} \qquad (2)$$

$$X_C = 1/(j\omega C) = -j\sqrt{L/C} \qquad (3)$$

As is clear from Equations (2) and (3), the inductive reactance component of the inductor 4 and the capacitive reactance component of the capacitor 5 are equal to each other in an absolute value but are different in signs, thereby operating to negate each other as shown in FIG. 4A.

On the other hand, because, in a RLC resonance circuit shown in FIG. 1, a reactance component is negated but a resistance component is not negated at a resonance point, an impedance does not come to zero as shown in FIG. 4B.

An impedance vector drawing in FIG. 4B is the drawing when the resistance element 3 is provided in parallel in the inductor 4 and, in the case of serially providing the resistance element 3 in the inductor 4, an impedance vector drawing shown in FIG. 4A is shifted in the right direction by the amount of resistance component of the resistance element 3. In other words, the resistance component is always kept constant, thereby the impedance of the RLC resonance circuit not coming to zero at the resonance point.

Figure 5A:
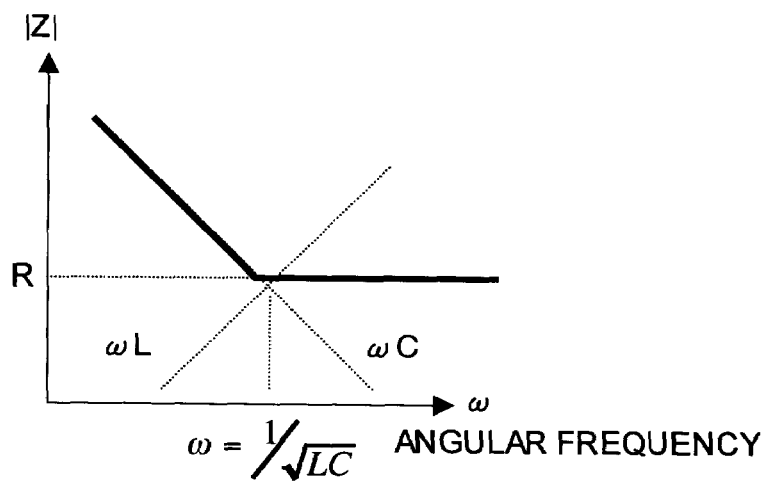
FIG. 5A is a schematic diagram of an impedance-frequency characteristic in an LCR resonance circuit in the bias circuit shown in FIG. 1.
Figure 5B:
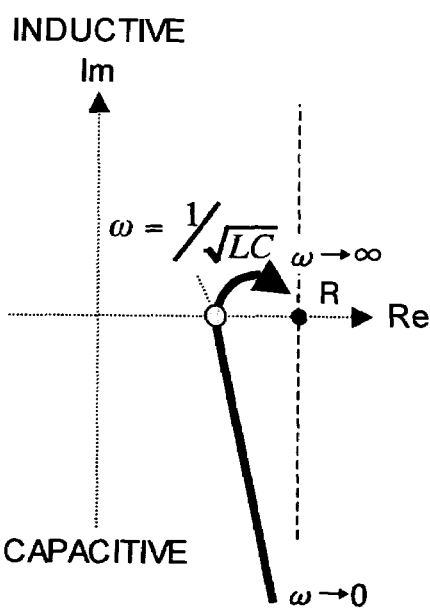
FIG. 5B is a diagram of an impedance orbit in the LCR resonance circuit.

FIG. 5A is a schematic diagram of an impedance-frequency characteristic in an LCR resonance circuit in the bias circuit shown in FIG. 1. FIG. 5B is a diagram of an impedance orbit of the LCR resonance circuit.

The resistance element 3 is connected to the inductor 4 in parallel in the LCR resonance circuit shown in FIG. 1. The impedance component of the LR parallel circuit not only has an imaginary part (i.e., the inductive reactance component) but also has a real part (i.e., the resistance component) and the impedance of the LCR resonance circuit has a fixed value determined by R, L, and C in the resonance frequency, not coming to zero. Thus, when the bias circuit is viewed from the high-speed signal line, it is possible to prevent impedance from decreasing at the resonance point.

As explained above, the resistance element is connected to the inductor in parallel in the embodiment. Therefore, even after a parasitic capacitance component generated due to mounting of the inductor is negated, a resistance component remains, so that decrease of impedance, when viewed from the transmission line, is prevented and a partial omission of the baseband signal or degradation of signal characteristics can be controlled.

Note that though in the embodiment the resistance element serving as an element to prevent decrease of impedance produced by resonating a parasitic capacitance generated by mounting the inductor and the inductor, when viewed from the high-speed signal transmission line, is used, the resistance element is not limited to a real resistance element and can be any one serving as a resistor particularly near a frequency (i.e., the resonance frequency) around which impedance remarkably decreases.

SECOND EMBODIMENT

Figure 6:
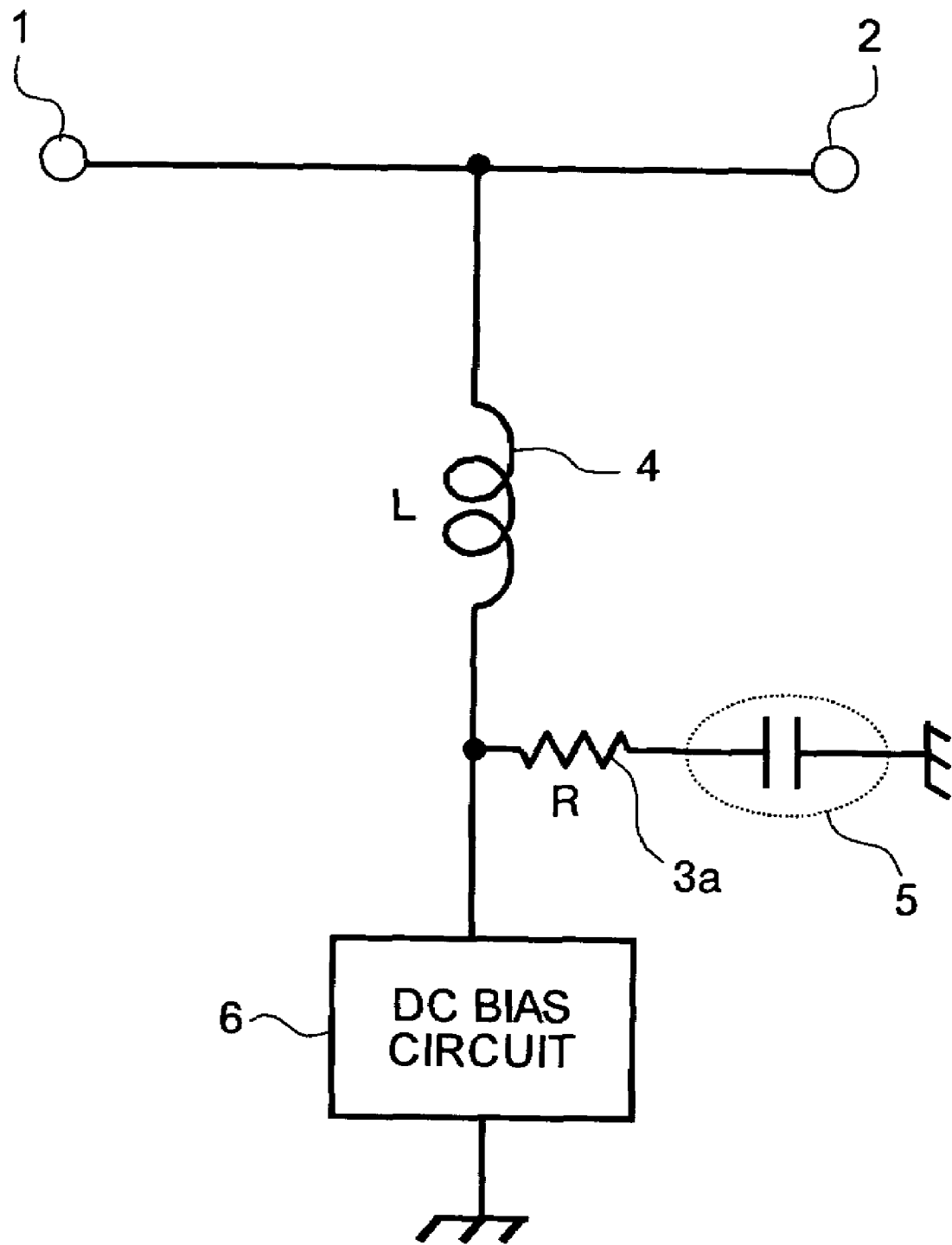
FIG. 6 is a circuit diagram of a bias circuit according to a second embodiment of the present invention.

FIG. 6 is a circuit diagram of a bias circuit according to a second embodiment of the present invention. In the bias circuit shown in FIG. 6, a resistance element 3a is serially connected to the capacitor 5, which is a parasitic capacitance, instead of being connected to the inductor 4 in parallel in as in the bias circuit shown in FIG. 1. The other components in the second embodiment are the same or equivalent to that of the first embodiment and have been given the same numerals or signs.

Figure 7A:
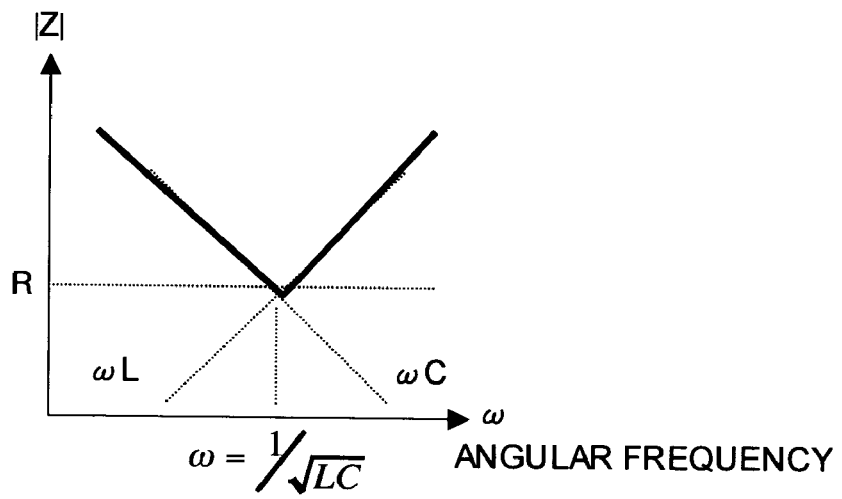
FIG. 7A is a schematic diagram of an impedance-frequency characteristic in an LCR resonance circuit in the bias circuit shown in FIG. 6.
Figure 7B:
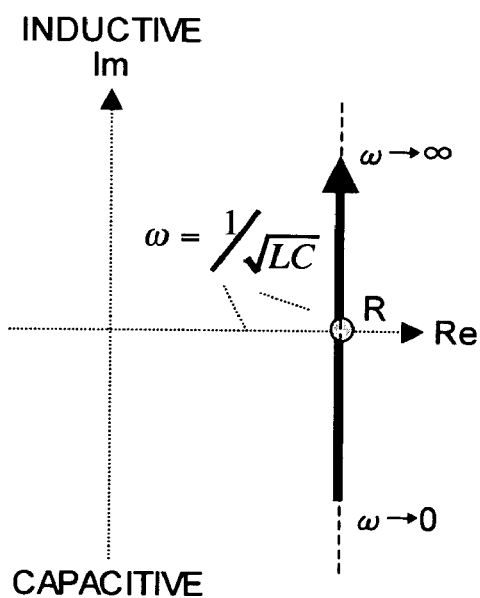
FIG. 7B is a diagram of an impedance orbit of the LCR resonance circuit.

Next, an explanation will be given about the operation of the bias circuit shown in FIG. 6. FIG. 7A is a schematic diagram of an impedance-frequency characteristic of the LCR resonance circuit in the bias circuit shown FIG. 6. FIG. 7B is a diagram of an impedance orbit in the LCR resonance circuit.

The LCR resonance circuit shown in FIG. 6 in which the resistance element 3a is serially connected to the capacitor 5 constitutes the LCR serial resonance circuit together with the inductor 4. Thus, the impedance in the circuit does not attain a value equal to or less than a resistance (R) of the resistance element 3a as shown in FIGS. 7A and 7B. As a result, it is possible to prevent impedance from decreasing at the resonance point, when the bias circuit is viewed from the high-speed signal line.

As explained above, according to second embodiment, the resistance element is serially connected to a parasitic capacitance generated due to mounting the inductor. Therefore, even after the parasitic capacitance component is negated, a resistance component remains, preventing impedance from decreasing when viewed from the transmission line and controlling partial omission of the baseband signal or degradation of signal characteristics.

In the second embodiment, in the same manner as in the first embodiment, though the resistance element serving as an element to prevent decrease of impedance that is produced by resonating a parasitic capacitance generated by mounting the inductor and the inductor, when viewed from the high-speed signal transmission line, is used, the resistance element is not limited to a real resistance element and can be any one serving as a resistor particularly near a resonance frequency around which impedance remarkably decreases.

THIRD EMBODIMENT

Figure 8:
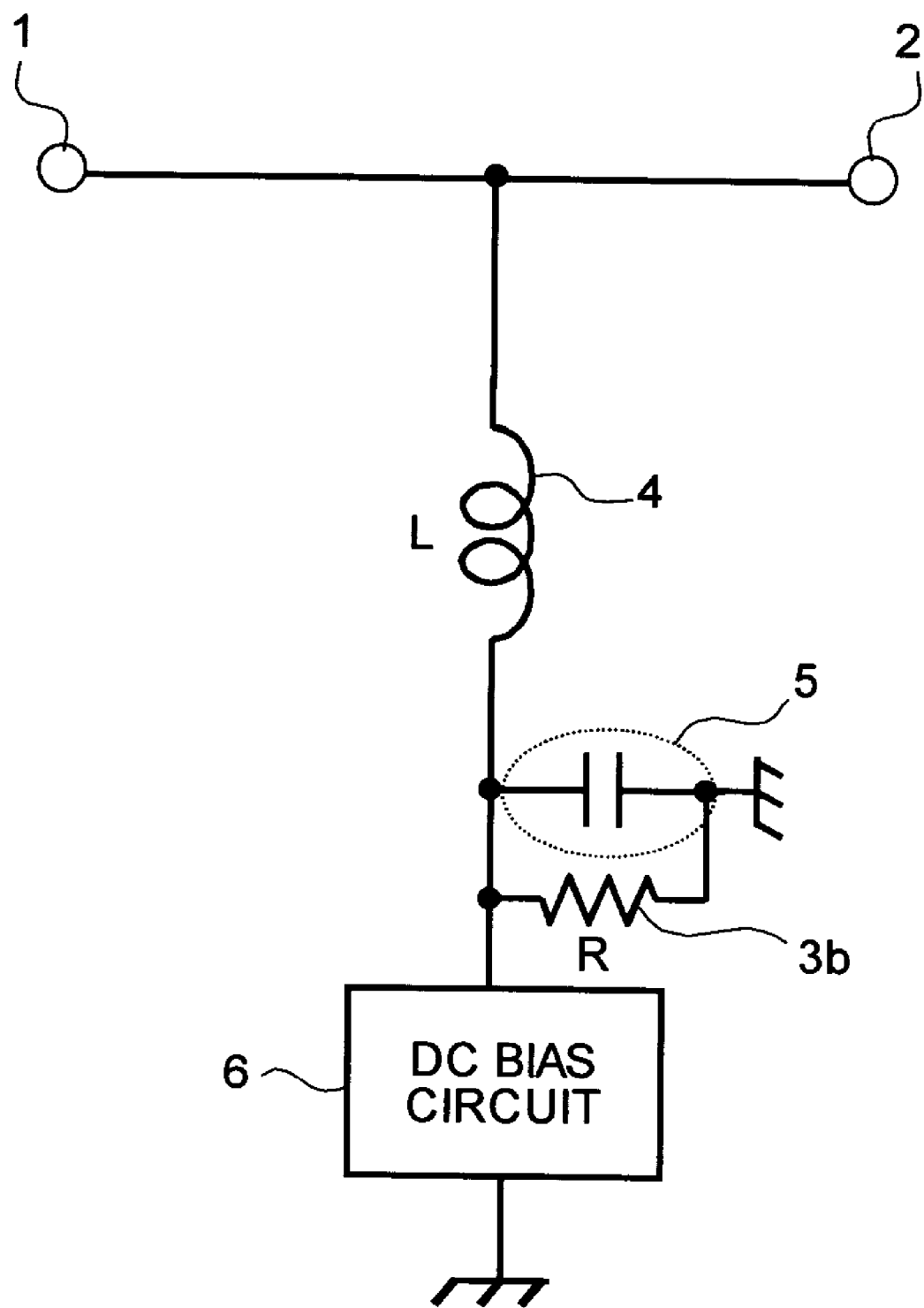
FIG. 8 is a circuit diagram of a bias circuit according to a third embodiment of the present invention.

FIG. 8 is a circuit diagram of a bias circuit according to a third embodiment of the present invention. In the bias circuit shown in FIG. 8, a resistance element 3b is connected to the capacitor 5, which is a parasitic capacitance, not serially but in parallel in the bias circuit of the second embodiment as shown in FIG. 6. The other components in the third embodiment are the same or equivalent to that of the second embodiment and have been given the same numerals or signs.

Figure 9A:
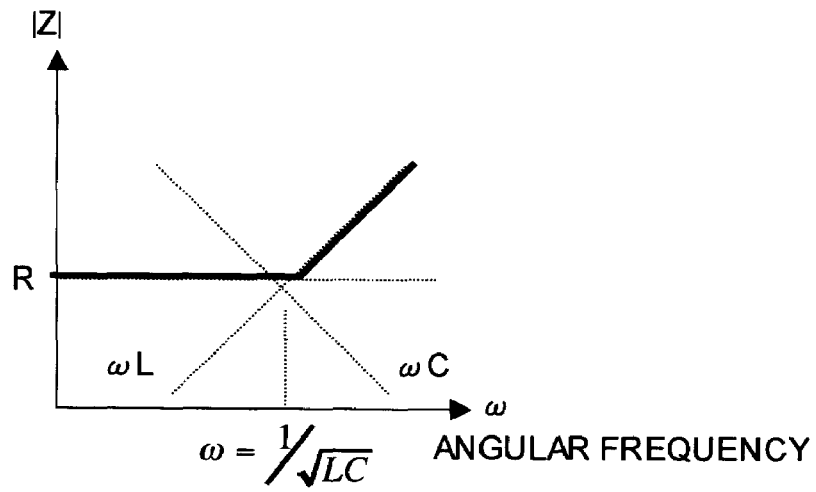
FIG. 9A is a schematic diagram of an impedance-frequency characteristic in an LCR resonance circuit in the bias circuit shown in FIG. 8.
Figure 9B:
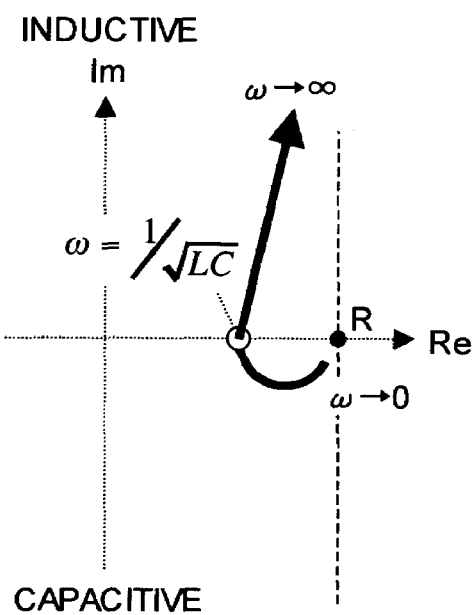
FIG. 9B is a diagram of an impedance orbit in the LCR resonance circuit.

Next, an explanation will be given about the operation of the bias circuit shown in FIG. 8. FIG. 9A is a schematic diagram of an impedance-frequency characteristic of the LCR resonance circuit in the bias circuit shown in FIG. 8. FIG. 9B is a diagram of an impedance orbit in the LCR resonance circuit. While the resistance element 3 is connected to the inductor 4 in parallel in the bias circuit shown in FIG. 1, the resistance element 3b is connected to the capacitor 5 in parallel in the bias circuit shown in FIG. 8. Accordingly, an impedance-frequency characteristic and an impedance orbit in the LCR resonance circuit are represented as each of the characteristics in FIGS. 9A and 9B which are symmetric with respect to FIGS. 7A and 7B respectively.

The resistance element 3b is connected to the capacitor 5 in parallel in the LCR resonance circuit shown in FIG. 8. The impedance component of the RC parallel circuit not only has an imaginary part (i.e., a capacitive reactance component) but also has a real part (i.e., a resistance component) and the impedance of the LCR resonance circuit has a fixed value determined by R, L, and C in the resonance frequency, not coming to zero. Thus, when the bias circuit is viewed from the high-speed signal line, it is possible to prevent impedance from decreasing at the resonance point.

As explained above, the resistance element is connected to the parasitic capacitance generated due to mounting of the inductor in parallel in the embodiment. Therefore, even after the parasitic capacitance component is negated, a resistance component remains, decrease of impedance, when viewed from the transmission line, is prevented and a partial omission of the baseband signal or degradation of signal characteristics can be controlled.

According to the third embodiment, in the same manner as in the other embodiments, though the resistance element serving as an element to prevent decrease of impedance produced by resonating the parasitic capacitance generated due to mounting of the inductor and the inductor, when viewed from the high-speed signal transmission line, is used, the resistance element is not limited to a real resistance element and may be any one serving as a resistor particularly near a resonance frequency around which impedance remarkably decreases.

FOURTH EMBODIMENT

Figure 10:
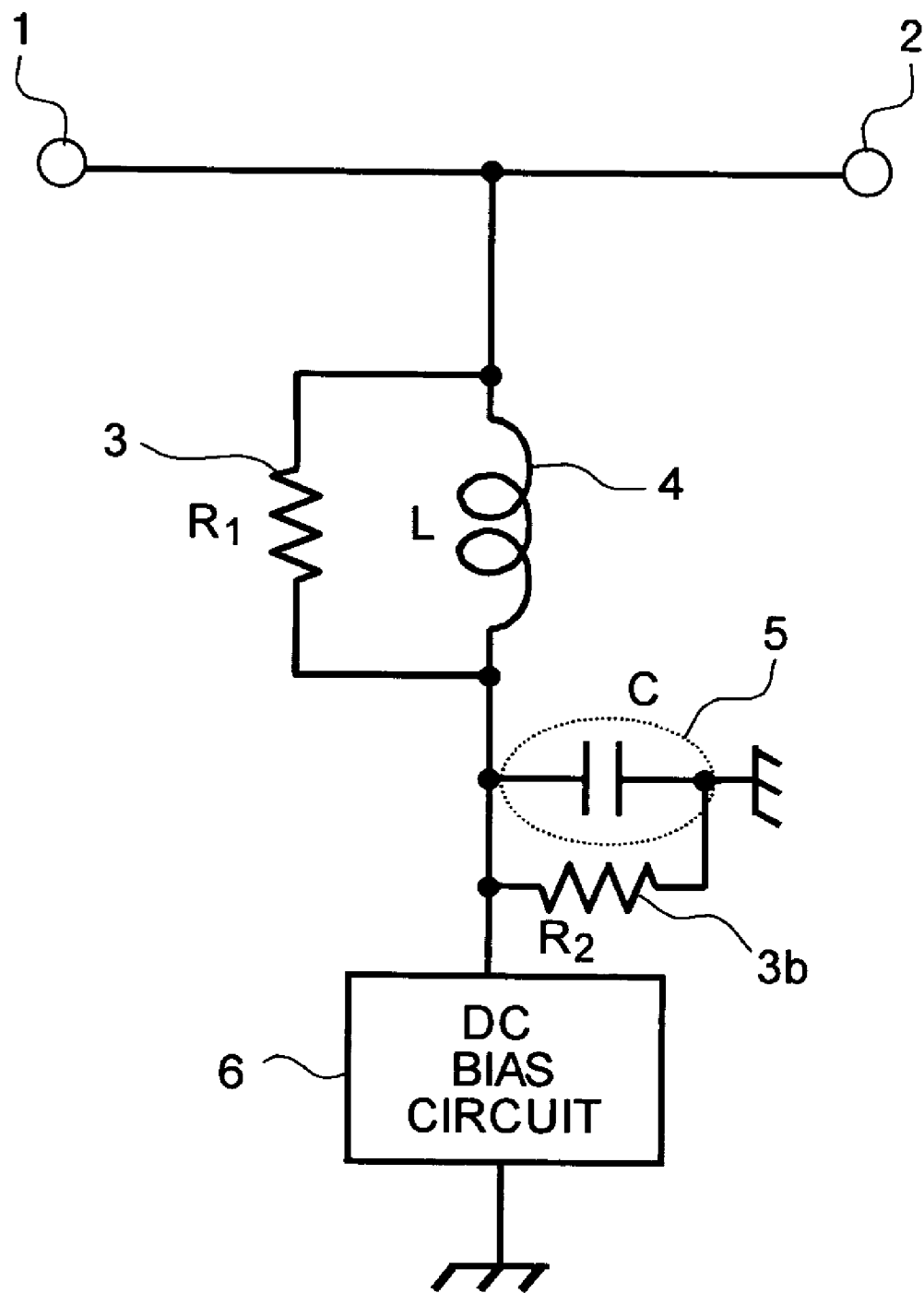
FIG. 10 is a circuit diagram of a bias circuit according to a fourth embodiment of the present invention.

FIG. 10 is a circuit diagram of a bias circuit according to a fourth embodiment of the present invention. In the bias circuit shown in FIG. 10, the resistance element 3b is connected in parallel to the capacitor 5, which is a parasitic capacitance, in addition to the bias circuit of the first embodiment as shown in FIG. 1. The other components in the fourth embodiment are the same or equivalent to that of the first embodiment and have been given the same numerals or signs.

Figure 11A:
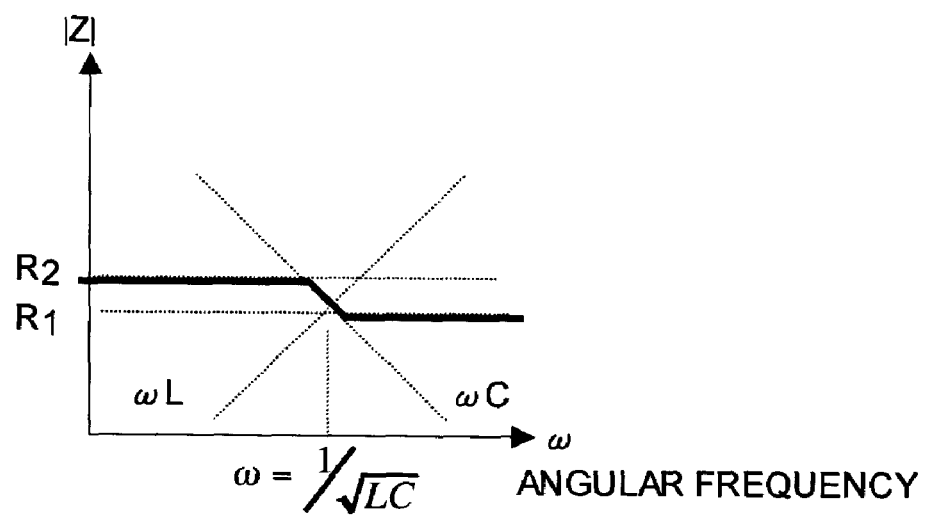
FIG. 11A is a schematic diagram of an impedance-frequency characteristic in an LCR resonance circuit in the bias circuit shown in FIG. 10.
Figure 11B:
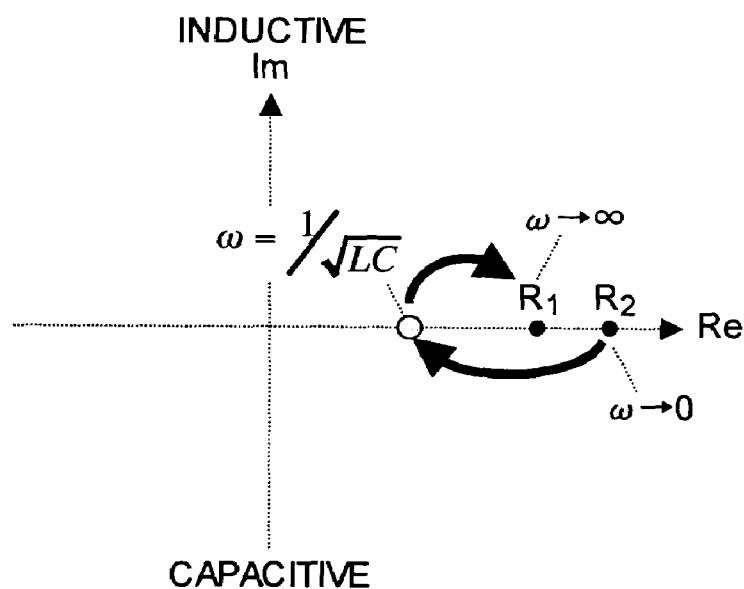
FIG. 11B is a diagram of an impedance orbit in the LCR resonance circuit.

Next, an explanation will be given about the operation of the bias circuit shown in FIG. 10. FIG. 11A is a schematic diagram of an impedance-frequency characteristic of the LCR resonance circuit in the bias circuit shown in FIG. 10. FIG. 11B is a diagram of an impedance orbit in the LCR resonance circuit. While the resistance element 3 is connected only to the inductor 4 in parallel in the bias circuit shown in FIG. 1, the resistance element 3b is connected also to the capacitor 5 in parallel in the bias circuit shown in FIG. 10.

Accordingly, the impedance-frequency characteristic in the LCR resonance circuit is represented in FIG. 11A, which is a combination of FIG. 5A and FIG. 9A. Likewise, the characteristic of the impedance orbit of the LCR resonance circuit is represented FIG. 11B, which is a combination of FIG. 5B and FIG. 9B.

In the LCR resonance circuit shown in FIG. 10, the resistance element 3 is connected to the inductor 4 in parallel and the impedance component of the LR parallel circuit not only has an imaginary part (i.e., an inductive reactance component) but also has a real part (i.e., a resistance component). Further, the resistance component 3b is connected to the capacitor 5 in parallel and the impedance component of the RC parallel circuit not only has an imaginary part (i.e., a capacitive reactance component) but also has a real part (i.e., a resistance component). Therefore, the impedance of the LCR resonance circuit made up of the resistance elements 3 and 3b, the inductor 4, and the capacitor 5 has a fixed value determined by $R_1$, $R_2$, L, and C in the resonance frequency and does not attain a value zero. Accordingly, this makes it possible to prevent impedance from decreasing at the resonance point, when the bias circuit is viewed from the high-speed signal line.

In addition, the impedance can be controlled within a prescribed range across a wide frequency band when viewed from the bias circuit, the bias power source can be stably supplied.

As explained above, the resistance element is connected in parallel to the inductor and the parasitic capacitance generated due to mounting of the inductor respectively in the fourth embodiment. Therefore, even after the parasitic capacitance component is negated, a resistance component remains, decrease of the impedance, when viewed from the transmission line, is prevented and partial omission of the baseband signal or degradation of signal characteristics can be controlled.

Note that though in the fourth embodiment the resistance element serving as an element to prevent impedance from decreasing that is generated by resonating a parasitic capacitance generated due to mounting of the inductor and the inductor, when viewed from the high-speed signal transmission line, is used, the resistance element is not limited to a real resistance element and can be any one serving as a resistor particularly near a resonance frequency around which impedance remarkably decreases in the same manner as in the other embodiments.

FIFTH EMBODIMENT

Figure 12:
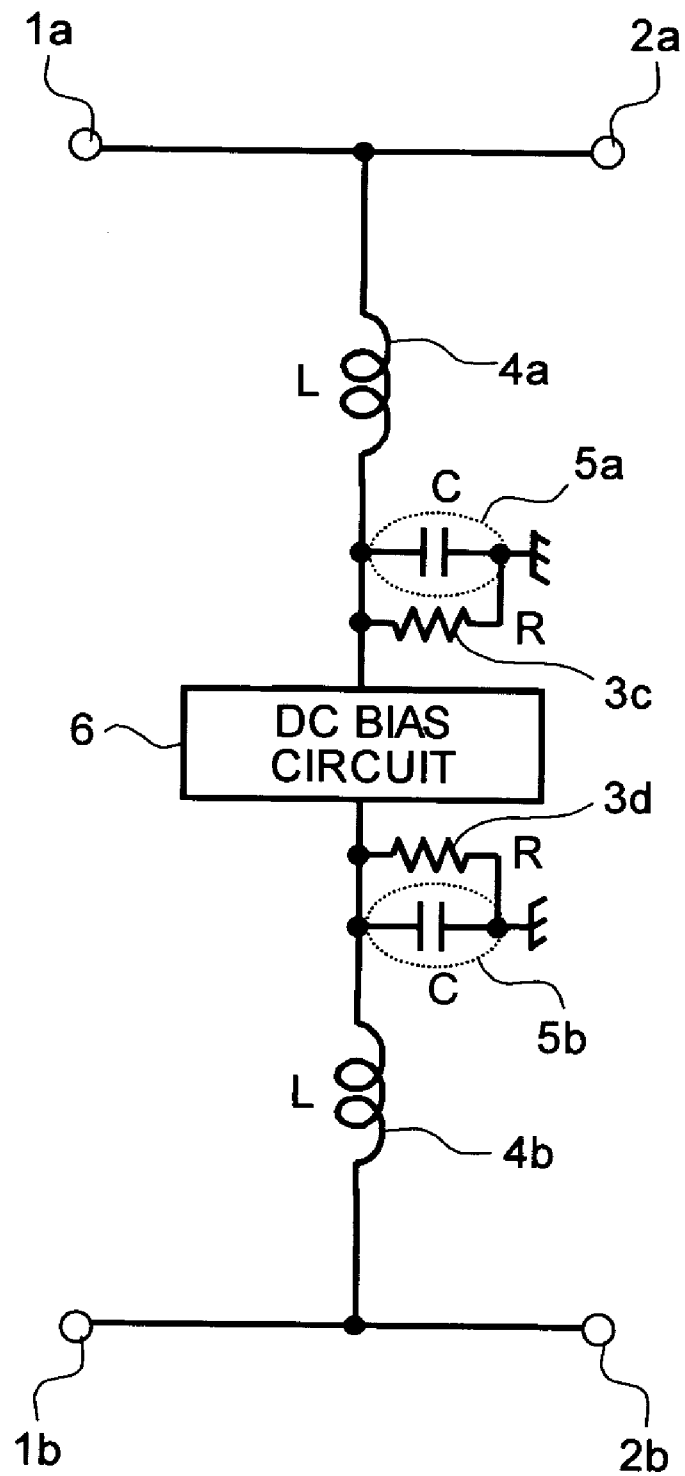
FIG. 12 is a circuit diagram of a bias circuit according to a fifth embodiment of the invention.

FIG. 12 is a circuit diagram of a bias circuit according to a fifth embodiment of the present invention. The bias circuit in the first embodiment as shown in FIG. 1 supplies bias power source to the single-phase high-speed signal line, while the bias circuit in the fifth embodiment supplies bias power source to each line with a DC bias circuit in common with respect to a differential high-speed signal line. The bias circuit in the fifth embodiment uses the bias circuit in the fourth embodiment with respect to the differential line and may use the bias circuit in another embodiment.

An impedance-frequency characteristic or an impedance orbit in the LCR resonance circuit in the bias circuit shown in FIG. 12 is such that each characteristic with respect to the single-phase line shown in the first to fourth embodiments is reflected to each line of the differential line.

As explained above, the resistance element is connected, in the fifth embodiment, in parallel to a parasitic capacitance generated due to mounting of the inductor for each of a pair of lines constituting a differential line. Therefore, even after the parasitic capacitance component is negated, a resistance component remains. Decrease of impedance, when viewed from the pair of transmission lines, is prevented and partial omission of the baseband signal or degradation of signal characteristics can be controlled.

Note that though in the fifth embodiment the resistance element serving as an element to prevent impedance from decreasing that is generated by resonating a parasitic capacitance produced due to mounting of the inductor and the inductor, when viewed from the high-speed signal transmission line, is used, the resistance element is not limited to a real resistance element and may be any one serving as a resistor particularly near a resonance frequency around which impedance remarkably decreases in the same manner as in the other embodiments.

SIXTH EMBODIMENT

Figure 13:
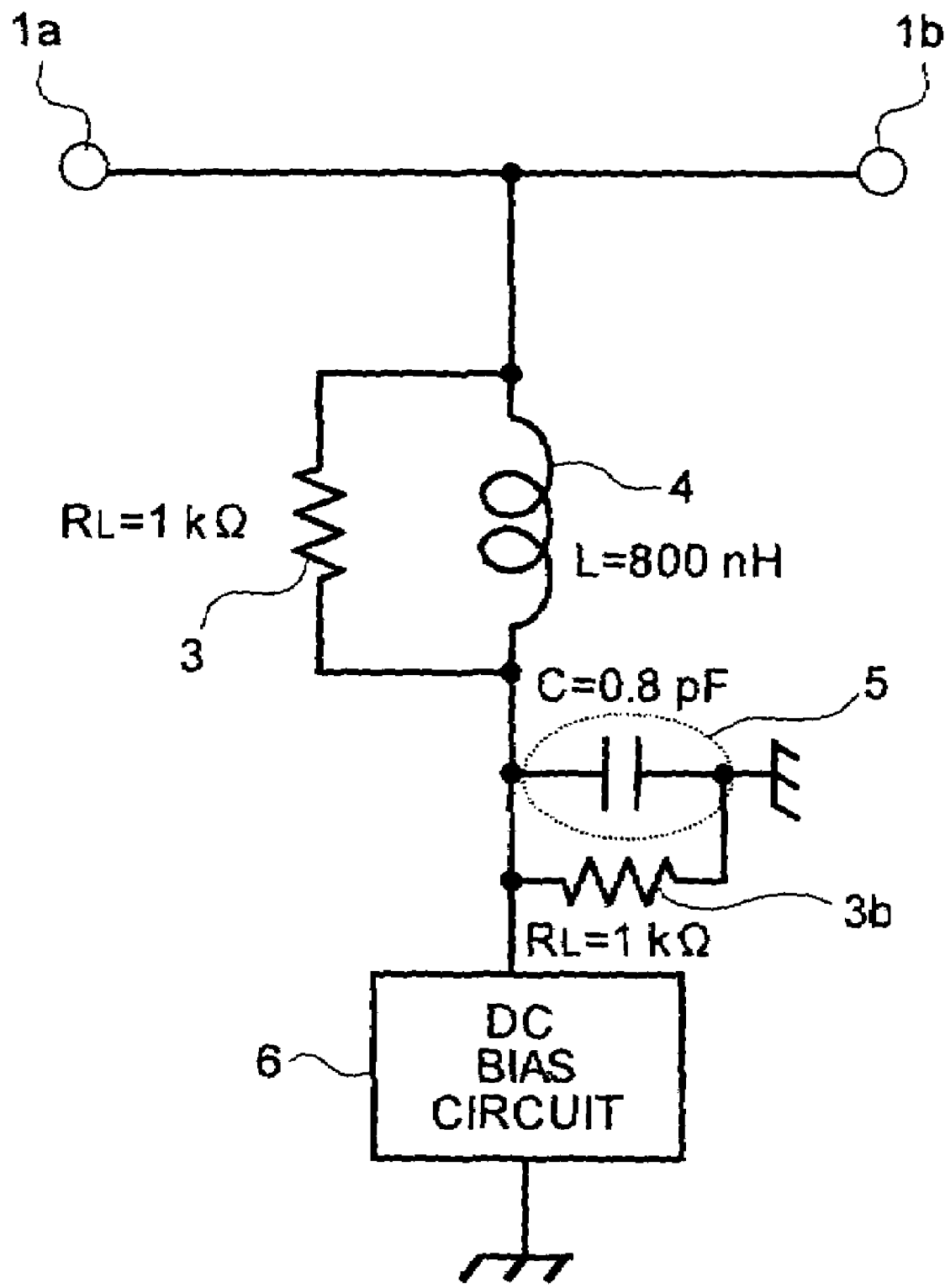
FIG. 13 is a circuit diagram of a bias circuit according to a sixth embodiment of the present invention.

FIG. 13 is a circuit diagram of the bias circuit according to a sixth embodiment of the present invention. The bias circuit in the sixth embodiment schematically depicts an exemplary specific example of the bias circuit in the fourth embodiment.

As explained in the fourth embodiment, because the resistance element 3 is connected to the inductor 4 in parallel, a resistance component is included in the impedance of the LR parallel circuit. Further, because the resistance element 3b is connected in parallel to the capacitor 5, which is a parasitic capacitance, a resistance component is included also in the impedance component of the RC parallel circuit.

Next, the impedance $Z_L$ of the LR parallel circuit and the impedance $Z_C$ of the RC parallel circuit are practically calculated.

First of all, the impedance $Z_L$ of the LR parallel circuit is given in the following equation:

$$Z_L = \frac{j\omega L R_1 (R_1 - j\omega L)}{R^2 + \omega^2 L^2} \tag{4}$$

Likewise, the impedance $Z_C$ of the RC parallel circuit is given in the following equation:

$$Z_C = \frac{R_2(1 - j\omega CR_2)}{1 + \omega^2 C^2 R^2} \quad (5)$$

Here, each of added resistance values is selected as follows, $$R_1 = R_2 = \sqrt{L/C} \quad (6)$$

a combined impedance $Z = Z_L + Z_C$ can be simplified by use of Equations (4), (5), and (6) as follows:

$$Z = \sqrt{L/C} \quad (7)$$

Based on Equation (7), the combined impedance Z is a fixed real value in the whole range of frequencies including DC.

Figure 14A:
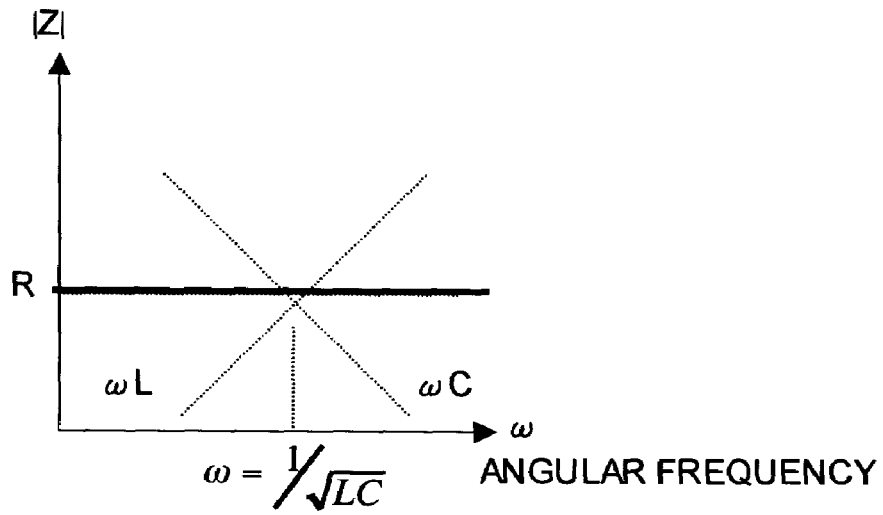
FIG. 14A is a schematic diagram of an impedance-frequency characteristic in an LCR resonance circuit in the bias circuit shown in FIG. 13.
Figure 14B:
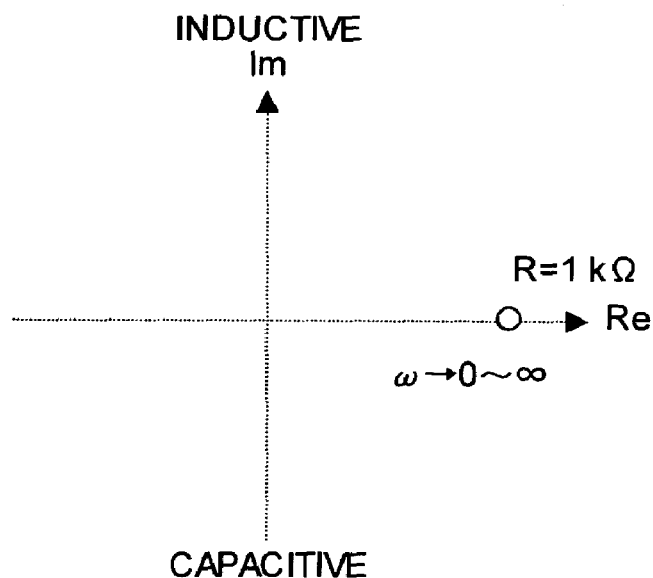
FIG. 14B is a diagram of an impedance orbit in the LCR resonance circuit.

FIG. 14A is a schematic diagram of an impedance-frequency characteristic of the LCR resonance circuit in the bias circuit shown in FIG. 13. FIG. 14B is a diagram of an impedance orbit in the LCR resonance circuit. A curved line shown in these drawings clearly indicates a fixed impedance characteristic shown in Equation (7).

Thus, if the resistances of the resistance elements 3 and 3b added to the inductor 4 and the capacitor 5 are set to satisfy Equation (6), a transfer function between input and output ports 1, 2 of a high frequency signal is a loss of a fixed real number determined by the above-mentioned R and the impedance in a high frequency signal line, thereby enabling to design an undistorted circuit that gives no influence on relative strength and phase among signal spectrums except a baseband signal of smaller amplitude.

For example, as shown in FIG. 13, if an inductance L of the inductor 4 is set to 800 nH, and a capacitance C of the capacitor 5 is set to 0.8 pF, the resistances $R_L$ of the resistance elements 3 and 3a is set to 1 kΩ, the impedance of the bias circuit is always 1 kΩ, and a 0.2-decibel loss when viewed from signal input and output ends can be kept all the time, thus enabling stable supply of bias power source.

As explained above, in the sixth embodiment, values of the inductor and the resistance element are set to prescribed values. Accordingly, even after a parasitic capacitance component generated due to mounting of the inductor is negated, a certain resistance component remains, preventing impedance from decreasing when viewed from the transmission line and controlling partial omission of the baseband signal or degradation of signal characteristics.

In the sixth embodiment, though the resistance element serving as an element to prevent decrease of impedance that is produced by resonating a parasitic capacitance generated due to mounting of the inductor and the inductor, when viewed from the high-speed signal transmission line, is used, the resistance element is not limited to a real resistance element and can be any one serving as a resistor particularly near a resonance frequency around which impedance remarkably decreases in the same manner as in the other embodiments.

In the embodiments hitherto, the inductor 4 or the resistance element 3 has been inserted outside of the DC bias circuit 6, however, a DC power source for the DC bias circuit 6 can be configured to include these components. For instance, the DC power source itself may have an inductance component of several hundreds nH or more and the resistance component added in parallel (or equivalently added) to the inductance component may have such a value as represented with Equation (6) based on a parasitic capacitance generated at a mounting stage and the inductance component.

INDUSTRIAL APPLICABILITY

The bias circuit according to the invention is, as stated above, useful as a bias circuit that applies DC bias to a semiconductor element, an optical modulator, or the like that amplifies a signal having a wide spectral component from a low frequency to a high frequency near DC like a baseband signal.

The invention claimed is:

1. A bias circuit that supplies bias voltage or bias current to one end of a transmission line, the bias circuit comprising:
   an inductor that prohibits a high frequency component of a baseband signal transmitted on the transmission line and passes a frequency component near direct current of the baseband signal; and
   an impedance-decrease prevention element that prevents impedance from decreasing, when viewed from the transmission line, that is produced due to a resonance between a parasitic capacitance generated between the mounting pattern of the inductor and a ground potential and an inductance of the inductor.

2. The bias circuit according to claim 1, wherein the impedance-decrease prevention element is a resistor.

3. The bias circuit according to claim 1, wherein the impedance-decrease prevention element is connected in parallel to the inductor.

4. The bias circuit according to claim 1, wherein the impedance-decrease prevention element is serially connected to the parasitic capacitance.

5. The bias circuit according to claim 1, wherein the impedance-decrease prevention element is connected in parallel to the parasitic capacitance.

6. The bias circuit according to claim 1, wherein the impedance-decrease prevention element is connected in parallel to the inductor and the parasitic capacitance respectively.

7. A bias circuit that supplies bias voltage or bias current to one ends of each of a pair of transmission lines that form a differential line, the bias circuit comprising:
   an inductor, corresponding to each of the transmission lines, that prohibits a high frequency component of a baseband signal transmitted on the transmission lines and passes a frequency component near direct current of the baseband signal; and
   an impedance-decrease prevention element, corresponding to each of the transmission lines, that prevents impedance from decreasing, when viewed from each of the differential lines, that is produced due to a resonance between a parasitic capacitance generated between the mounting pattern of the inductor and a ground potential and an inductance of the inductor.

8. The bias circuit according to claim 7, wherein the impedance-decrease prevention element is connected in parallel to the inductor.

9. The bias circuit according to claim 7, wherein the impedance-decrease prevention element is serially connected to the parasitic capacitance.

10. The bias circuit according to claim 7, wherein the impedance-decrease prevention element is connected in parallel to the parasitic capacitance.

11. A bias circuit that supplies bias voltage or bias current to one end of a transmission line, the bias circuit comprising:

an inductor that prohibits a high frequency component of a baseband signal transmitted on the transmission line and passes a frequency component near direct current of the baseband signal;

an impedance-decrease prevention element that prevents impedance from decreasing, when viewed from the transmission line, that is produced due to a resonance between a parasitic capacitance generated between the mounting pattern of the inductor and a ground potential and an inductance of the inductor; and a DC power source having:
  an inductance of the inductor; and
  a resistance component of the impedance-decrease prevention element, wherein
  the inductance is set to several hundreds nH or more and the resistance component is set substantially equal to a square root of a ratio of the inductance and the parasitic capacitance.

* * * * *